United States Patent
Davis et al.

(10) Patent No.: US 6,981,185 B1
(45) Date of Patent: Dec. 27, 2005

(54) METHODS AND APPARATUS TO CORRECT DUTY CYCLE

(75) Inventors: Barry Allen Davis, Union City, CA (US); Walter F. Bridgewater, San Jose, CA (US)

(73) Assignee: Adaptec, Inc., Milpitas, CA (US)

( * ) Notice: Subject to any disclaimer, the term of this patent is extended or adjusted under 35 U.S.C. 154(b) by 457 days.

(21) Appl. No.: 10/215,919

(22) Filed: Aug. 9, 2002

(51) Int. Cl.[7] ............................................. G06F 11/00
(52) U.S. Cl. ...................................... 714/707; 714/709
(58) Field of Search ............................... 327/175, 158, 327/178; 375/317; 341/118; 714/709, 712, 714/707

(56) References Cited

U.S. PATENT DOCUMENTS

| | | | | |
|---|---|---|---|---|
| 4,527,075 A | * | 7/1985 | Zbinden | 327/175 |
| 4,736,391 A | * | 4/1988 | Siegel | 375/317 |
| 4,996,529 A | * | 2/1991 | Connell | 341/118 |
| 5,614,855 A | * | 3/1997 | Lee et al. | 327/158 |
| 5,945,862 A | * | 8/1999 | Donnelly et al. | 327/278 |
| 6,034,551 A | | 3/2000 | Bridgewater, Jr. | |

* cited by examiner

*Primary Examiner*—David Ton
(74) *Attorney, Agent, or Firm*—Martine Penilla & Gencarella, LLP (57) ABSTRACT

An apparatus for correcting duty cycle error is provided which includes circuitry capable of determining existence of a duty cycle error from input data received over data transmissions lines where the circuitry generates duty cycle correction data based on the duty cycle error. The apparatus also includes a digital analog converter (DAC) being coupled to the circuitry where the DAC is capable of receiving a magnitude portion of the duty cycle correction data from the circuitry. The apparatus further includes an adjustable bias driver being coupled to the circuitry, the DAC and the data transmission lines. The adjustable bias driver receives the magnitude portion of the duty cycle correction data from the DAC and receives a polarity portion of the duty cycle correction data from the circuitry where the adjustable bias driver adjusts the polarity of signals applied to the data transmission lines for correcting the duty cycle error.

25 Claims, 5 Drawing Sheets

METHODS AND APPARATUS TO CORRECT DUTY CYCLE

BACKGROUND OF THE INVENTION

1. Field of the Invention

This invention relates generally to the field of computing technology and more particularly concerns the correcting of duty cycles during the data transmission over a computer system or network.

2. Description of the Related Art

In computer technology, data transmission may take place in a computer system. In addition, computers may intercommunicate through data transmission through a network connecting numerous computers. For example, in a typical computer system, a computer system may include a computer and a storage device connected to it. For the computer to transfer data to and from the storage device, an input and output connected by differential drivers may be utilized.

Within a computer system, it is often desirable to connect a variety of peripherals to the system bus of the computer itself for communication with the central processing unit and other devices connected to the computer. A variety of bus types may be used, and for any bus it is important to have bus drivers and bus receivers that allow devices to communicate quickly, efficiently and accurately.

Figure 1A:
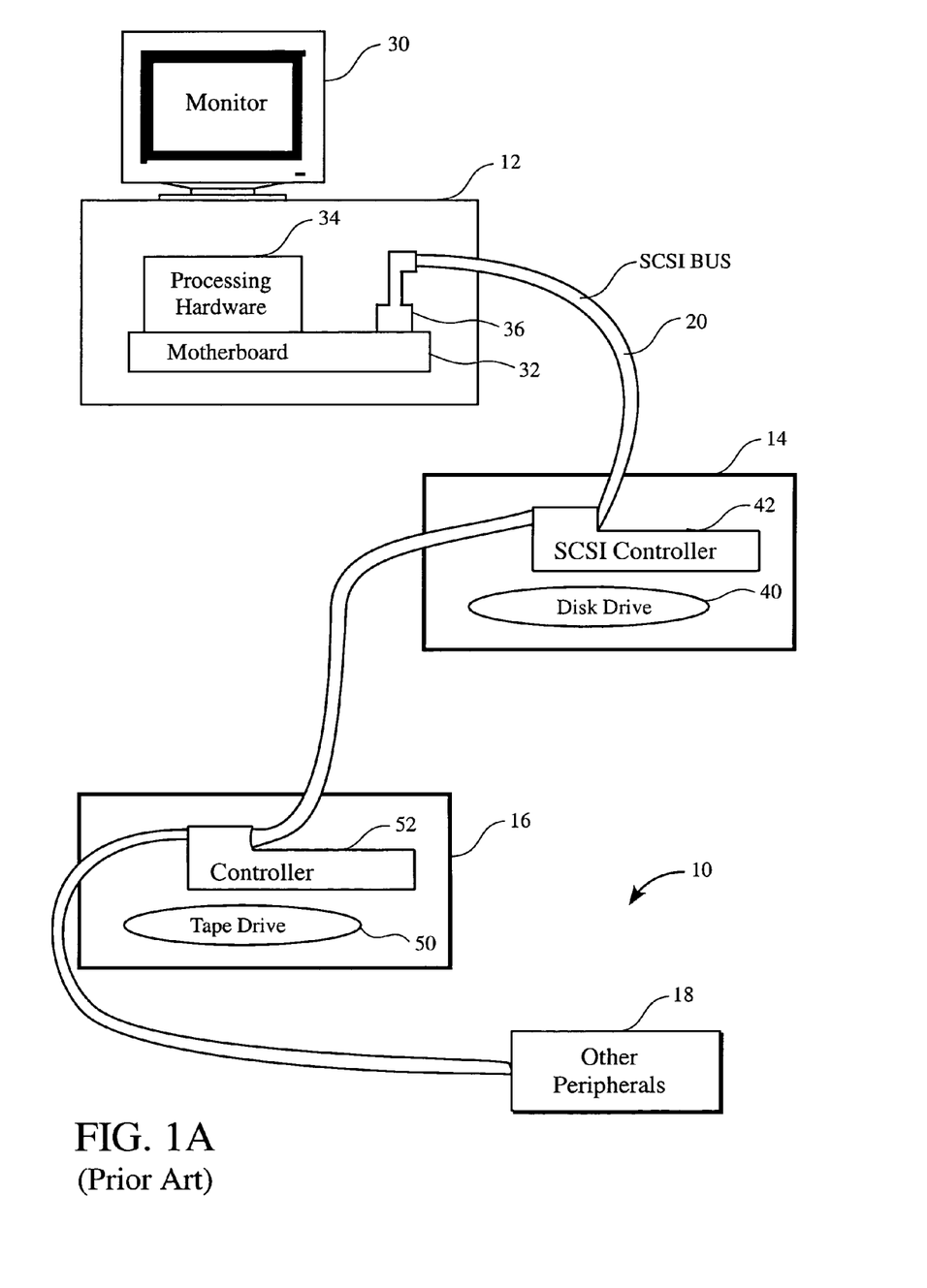
FIG. 1A illustrates an embodiment of a computer system.

FIG. 1A illustrates an embodiment of a computer system 10. Computer system 10 includes a computer 12, a disk drive 14, a tape drive 16, and any number of other peripherals 18 such as card reader units, voice input/output, displays, video input/output, scanners, etc. The computer and peripherals in this example are connected via a Small Computer System Interface (SCSI) bus 20, although a wide variety of other buses may also be used.

Any number of computers or hosts may be present in computer system 10 and be connected to SCSI bus 20. Each computer may also contain a variety of hardware and software. By way of example, computer 12 includes a monitor 30, a motherboard 32, a wide variety of processing hardware and software 34 and a SCSI host adapter card (or interface card) 36. Host adapter card 36 provides an interface between the microcomputer bus of computer 12 located on motherboard 32 and SCSI bus 20.

SCSI is a universal parallel interface standard for connecting disks and other high performance peripherals to microcomputers. However, it should be appreciated that computer system 10 is an example of a system, and other interface standards having characteristics similar to SCSI may also be used in such a computer system. By way of example, an Intelligent Peripheral Interface (IPI) standard is one such other standard.

In one example, SCSI bus 20 is an 8-bit parallel flat cable interface (18 total signals) with hand shakes and protocols for handling multiple hosts and multiple peripherals. It has both a synchronous and an asynchronous mode, and has defined software protocols. In the embodiment shown, the SCSI bus uses differential drivers, although SCSI is also available with single wire drivers. SCSI interface cards (such as card 36) plug into most microcomputer buses including VME, Multibus I and II, PCI, ISA, VL, EISA and MCA. In another embodiment, SCSI bus 20 is a 16-bit parallel cable interface (27 total signals). In other embodiments motherboard 32 has SCSI adapter card 36 incorporated into the motherboard itself, and a separate, plug-in adapter card is not needed. SCSI bus 20 is a multi-drop bus typically produced as a flat cable that connects from a computer 12 to any number of peripherals. In this example, disk drive 14, tape drive 16, and other peripherals 18 connect to SCSI bus 20 by tapping into the bus. In other examples, it is possible for any number of peripherals to be inside computer 12 in which case SCSI bus 20 may also be present inside computer 12 also.

Disk drive 14 includes the physical disk drive unit 40 and SCSI controller card 42 and other internal cables and device level interfaces (not shown) for enabling the unit to communicate with computer 12. After connecting to disk drive 14, SCSI bus 20 continues on to connect to tape drive 16. Tape drive 16 includes the physical tape drive 50, SCSI controller card 52, and other internal cables and interfaces (not shown) for communicating with computer 12.

SCSI bus 20 also connects to any number of other peripherals 18. In alternative embodiments of the invention, any of the peripherals shown may eliminate the SCSI controller card by using an "embedded SCSI" architecture in which the SCSI bus becomes also the device level interface. In these peripherals, a cable such as SCSI bus 20 may be connected directly from motherboard 32 of a computer to a peripheral without the need for connecting to an internal controller card.

Figure 1B:
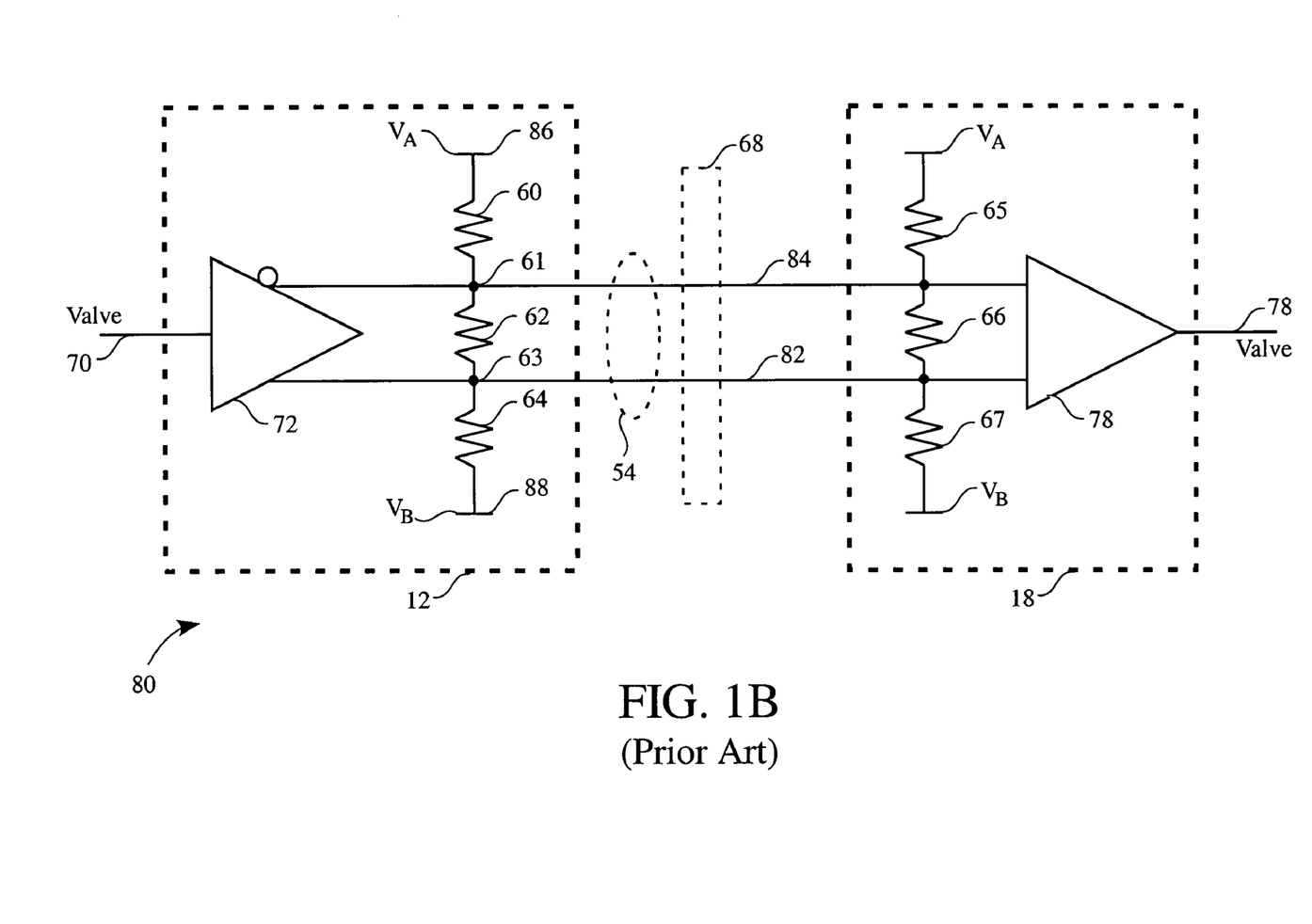
FIG. 1B shows an apparatus by which value is transmitted from computer to peripheral.

FIG. 1B shows an apparatus 80 by which value 70 is transmitted from computer 12 to peripheral 18. FIG. 1B shows a value 70 being transmitted by a driver 72 from computer 12 to a receiver 78 in peripheral 18. Because SCSI bus 20 uses a voltage differential technique of transferring information, value 70 is transmitted using a signal line 82 from driver 72 and also using its complement, signal 84. In other words, signal lines 82 and 84 are used to transmit information for bus line data 54. In a similar fashion, information for other bus lines is transmitted using two signal lines.

The SCSI bus also uses a bias voltage in the termination at each end of the SCSI bus. The termination bias voltage is used during the arbitration phase of SCSI protocol in order to help determine which devices are asserting which bits on the bus. Without a termination bias voltage, it would be difficult to determine which device is asserting a data bit because bits not being asserted would be floating. The need for a termination bias voltage on a SCSI bus and its ramifications are discussed in greater detail below. To achieve the termination bias voltage, computer 12 includes a voltage source V(A) 86 (for example, 1.5 volts) and a voltage source V(B) 88 (for example, 1.0 volt) which are connected in series using resistors 60 (for example, 270 ohms), resistor 62 (for example, 138 ohms), and resistor 64 (for example, 270 ohms). This termination bias voltage circuit is connected to signal lines 82 and 84 as shown. Thus, point 61 is typically at 1.3 volts due to the termination bias voltage, and point 63 is typically at 1.2 volts due to the termination bias voltage. The termination bias voltage also results in an approximate termination resistance of 110 ohms.

In a similar fashion, peripheral 18 also includes a termination bias voltage. As in computer 12, resistors 65, 66, and 67 connect in series voltages V(A) and V(B). These voltages and resistances may have similar values as for computer 12 and are connected to signal lines 82 and 84 as shown. Also shown in FIG. 1B are multiple bus taps 68 symbolizing the variety of other devices, computers, and peripherals that may also tap onto SCSI bus 50.

This technique for transmitting data over a SCSI bus uses a low-voltage swing differential (LVD) driver and a low offset voltage, high-speed, differential input receiver. The driver for this type of SCSI bus uses an asymmetrical output, where one direction has more drive strength than the other.

The reason for this asymmetrical output is because of the termination bias voltage as shown in FIG. 1B.

Unfortunately, this termination bias voltage and the asymmetrical driver output that it necessitates can have undesirable effects. The reason for the need for a termination bias voltage has to do with the dual use of the data lines of a SCSI bus. A SCSI bus includes data lines that are used during a data phase of communication, i.e., high-speed transmission of data. A SCSI bus also includes various control lines that are used to transmit control signals at a lower speed during a protocol phase of communication on the bus. However, the data lines of a SCSI bus have a dual use. During the protocol phase of communication, the data lines are also used to transmit control signals used for arbitration on the bus. Thus, the data lines of a SCSI bus must be able to operate in a high-speed data phase and also in a low-speed protocol phase. Operation of these lines in the protocol phase requires a termination bias voltage.

The data lines have this dual use because of the way peripherals indicate when they wish to use the SCSI bus. When a peripheral on a SCSI bus wishes to use the bus, it asserts one of the data lines. Each peripheral on the bus is associated with one of the data lines, thus it can be determined which peripheral wants to use the bus by which data line is being asserted. However, when one peripheral is asserting one data line, the other data signals must be driven to a known state so that the SCSI bus and its attached devices can determine which data line is being asserted. In other words, if the data lines are simply floated it would be difficult to determine which of many data lines is being asserted.

Therefore, pull-up voltages are used at each end of the SCSI bus so that any non-driven data lines are put into a negated state. Thus, when one peripheral asserts one data line, all of the other data lines will be in a negated state and it may then be determined which peripheral wishes to use the bus. These pull-up voltages are called termination bias voltages and are due to the dual use of the data lines of a SCSI bus. A termination bias voltage is present at each end of a SCSI bus and is used with single-ended drivers and also with differential drivers.

Duty cycle errors can be created because delay differences may exist in a driver. Delay from the input to the noninverting output may be different from the input to the inverting output. In addition, there could also be an offset on the receiver. In SCSI systems, there are more complicating factors and more offset. In such a system, there can be a differential transmitter and differential receiver where there is a termination by the transmitter and a termination by the receiver. If a top transmission line is inverting and a bottom transmission line is noninverting then a termination may exist that has a bias. Therefore, a positive voltage and a negative voltage may exist in which case the termination can cause an offset onto the line. This is typically done intentionally because it was believed that it was a good way to keep line in a determined state. Unfortunately, the offset that is put in, when there is attenuation the duty cycle may be adversely affected and generate more duty cycle error. If a square wave is transitted where 50% of the time high and 50% low. This means that in a 50% duty cycle, 50% of the signal is low and 50% of the signal is high. This is typically desired in a data transmission signal. If a system can transmit and receive 50% duty cycle then it can determine if there is an error exists in the transmission signal by calibrating transmission system at 50% (i.e., if transmit at 50%, want to receive 50% so one knows that transmission media is not distorting the signal). In a SCSI system, the offset is going to generate duty cycle distortion. SCSI specification makes the SCSI driver have an unbalanced output such that the outputs cancel out the offset. Instead of having an unbalanced output, an anti-offset or anti-bias can be used to cancel out the offset that is built in. Therefore, a symmetrical driver may be used to apply an anti-offset. Unfortunately, in such a system, two sources of duty cycle errors are then produced with one source from the termination and an additional source from the driver. Problem is bad in a SCSI system because the termination and the offset driver can introduce a lot more error. Therefore, those problems are undesirable because duty cycle error means that there is an error in the data transmitted and received. If a 50/50 duty cycle is sent and 40/60 is received then the cycle receiving the 40 has lost some of its margin. Consequentially, timing margin is minimized in one direction. If one is receiving an input signal a particular voltage is used where ideally centered between the extremes of the two signals. If the signal is moved around sample voltage is desired but not attained and becomes randomized which can cause duty cycle error. Therefore it is desirable to eliminate the offset and the resulting duty cycle error so data transmission may be optimized.

In view of the foregoing, what is needed is a way to correct duty cycle errors. Such an approach would thereby ensure proper data transmission in a computer system.

SUMMARY OF THE INVENTION

Broadly speaking, the present invention fills these needs by providing methods and apparatus to detect duty cycle errors and to drive the duty cycle errors to zero in order to optimize data transmission. It should be appreciated that the present invention can be implemented in numerous ways, including as a process, an apparatus, a system, computer readable media, or a device. Several inventive embodiments of the present invention are described below.

In one embodiment, an apparatus for correcting duty cycle error in a data transmission system is provided. The apparatus includes an oversampler being configured to oversample an input signal, and an accumulator coupled to the oversampler. The accumulator generates an accumulated high bit signal and an accumulated low bit signal from the oversampled input signal received from the oversampler. The apparatus also includes a comparator coupled to the accumulator. The comparator receives an accumulated high bit signal and an accumulated low bit signal from the accumulator. The comparator compares an amount of the accumulated high bit signal and the accumulated low bit signal. The apparatus further includes a successive approximation register (SAR) logic coupled to the comparator where the SAR logic receives a compared signal from the comparator and determines a duty cycle error. The SAR logic is capable of generating polarity data and magnitude data for correcting the duty cycle error. The apparatus also includes an output register coupled to the SAR logic where the output register forwards the polarity data to an adjustable driver and sends the magnitude data to a digital analog converter (DAC).

In another embodiment, an apparatus for correcting duty cycle error is provided which includes circuitry capable of determining existence of a duty cycle error from input data received over data transmissions lines where the circuitry generates duty cycle correction data based on the duty cycle error. The apparatus also includes a digital analog converter (DAC) being coupled to the circuitry where the DAC is capable of receiving a magnitude portion of the duty cycle correction data from the circuitry. The apparatus further includes an adjustable bias driver being coupled to the circuitry, the DAC and the data transmission lines. The adjustable bias driver receives the magnitude portion of the duty cycle correction data from the DAC and receives a polarity portion of the duty cycle correction data from the circuitry where the adjustable bias driver adjusts the polarity of signals applied to the data transmission lines for correcting the duty cycle error.

In yet another embodiment, a method for correcting duty cycle in a data transmission system is provided. The method includes receiving an oversample of data, summing a plurality of positive duty cycles from the oversample of data, and summing a plurality of negative duty cycles from the oversample of data. The method further includes comparing the summed plurality of positive duty cycles with the summed plurality of negative duty cycles, and driving a duty cycle to zero by adjusting an output of a bias driver to a negative bias when the summed plurality of positive duty cycles is greater than the summed plurality of negative duty cycles, and by adjusting the output of the bias driver to a positive bias when the summed plurality of positive duty cycles is less than the summed plurality of negative duty cycles.

In another embodiment, a method for correcting duty cycle in a data transmission system is provided. The method includes determining a duty cycle error from input data, and driving the duty cycle error to zero by directing a bias driver to output one of a negative bias and a positive bias to data transmission lines carrying the input data.

The advantages of the present invention are numerous. Specifically, by having circuitry that can determine duty cycle errors and correct duty cycle errors, data transmission may be optimized. Specifically, a oversampler and successive approximation register (SAR) control logic may detect duty cycle errors and may direct an adjustable bias driver to drive the duty cycle error to zero. Therefore, more data may be transmitted more accurately than previously possible thereby optimizing data management in a computer system. As a result, data transmission reliability may be optimized.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

An invention is described for a method of optimizing data transmission in a SCSI system where duty cycle errors are corrected through use of duty cycle error management circuitry and an adjustable bias driver to drive away offset that may cause duty cycle error. It will be obvious, however, to one skilled in the art, that the present invention may be practiced without some or all of these specific details. In other instances, well known process operations have not been described in detail in order not to unnecessarily obscure the present invention.

The present invention may implemented using an appropriate type of software driven computer-implemented operation. As such, various computer-implemented operations involving data stored in computer systems to drive computer peripheral devices (i.e., in the form of software drivers) may be employed. These operations are those requiring physical manipulation of physical quantities. Usually, though not necessarily, these quantities take the form of electrical or magnetic signals capable of being stored, transferred, combined, compared and otherwise manipulated. Further, the manipulations performed are often referred to in terms such as ascertaining, identifying, scanning, or comparing.

In general terms, the present invention optimizes data transmission from a transmitter to a receiver. The receiver examines an input signal from a driver that is intended to be a 50/50 duty cycle signal which is typically a training signal used by the SCSI standard. By utilizing an oversampling system, numerous samples are counted and examined to determine duty cycle errors and correct duty cycle errors. The offset cancellation is conducted on the receiver end of the transmission system. The receiver offset cancellation removes bias cancellation errors caused by either inaccuracies in the terminators or in the bias cancellation circuit in the drivers to significantly improve signal quality when a SCSI bus is being driven. It should be understood that although the present inventions are described by using a SCSI data transmission system, the present inventions may be utilized in any suitable data transmission system where correcting duty cycle is desirable.

Figure 2:
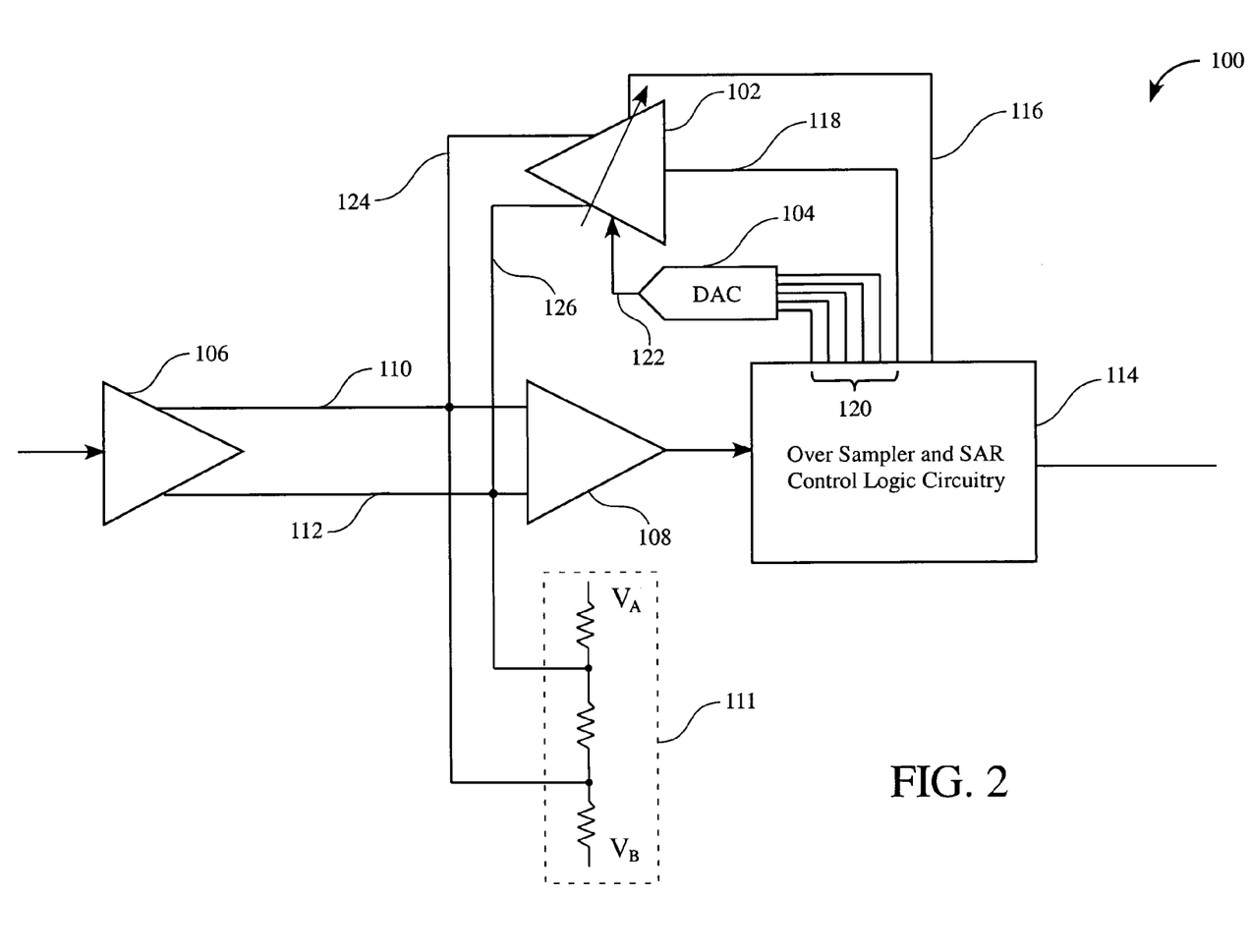
FIG. 2 shows a driver and receiver configuration in accordance with one embodiment of the present invention.

FIG. 2 shows a driver and receiver configuration in accordance with one embodiment of the present invention. In this embodiment, a driver 106 is connected with a receiver 108 through a top line 110 and a bottom line 112. The top line 110 and bottom line 112 are connected by a termination offset 111. In this embodiment, the top line 110 is inverting and the bottom line 112 is noninverting (or vice versa in another embodiment). The termination in this connection has a bias with a positive and a negative voltage. The termination therefore will cause an offset to the line. Unfortunately, the offset creates even more distortion of the duty cycle when there is attenuation, because the offset may generate even more duty cycle errors. Therefore, to attain optimal data transmission, the error is desired to be driven to zero. To drive the error to zero, an Adjustable Bias Driver (ABD) 102 is caused to generate a correction signal equal in magnitude but with polarity opposite to the bias error. In one embodiment, the offset that typically occurs in this type of transmission configuration is accounted for and reduced by use of an Oversampler and Successive Approximation Register (SAR) Control Logic Circuitry (hereinafter "Circuitry") 114. It should be understood that the Circuitry 114 may be any suitable type or configuration of circuitry or logic that may enable the operations as described herein in reference to FIGS. 2 through 4. The Circuitry 114 communicates with the ABD 102 which adjusts the offset between the differential lines 110 and 112 using the input from the Circuitry 114. Therefore, as discussed in more detail below, the Circuitry 114 can detect the amount of bias on the differential data transmission lines 110 and 112 from the input signals, and then by varying an input signal to the ABD 102, the Circuit 114 can compensate for the offset by managing the ABD 102 to change the bias of the lines 110 and 112 depending on the offset found in the system.

The Circuitry 114 utilizes the method as described below in FIG. 3 to enable offset detection and offset cancellation operations. First, the Circuitry 114 can detect offset in the lines 110 and 112. After this is determined, the Circuitry 114 may determine how much the bias is to be driven and the direction (+ or −) that the offset is to be driven. The signal regarding how much to drive the bias is sent in through 5 magnitude bits to a digital analog converter (DAC) 104. The DAC 104 then converts the digital signal to an analog signal and transfers the analog signal to the Adjustable Bias Driver 102 through lines 122 and 124. The ABD 102 drives the magnitude signal from the DAC 104 to the input receiver. The Circuitry 114 also determines the polarity of the offset and sets a bit indicating a positive bias or a negative bias and sends this signal to the ABD 102 through a polarity line 118. The polarity signal (also known as a polarity data) tells the ABD 102 to drive the offset in a positive or a negative direction. In addition, the Circuitry 114 sends an Enable output signal through line 116 to the ABD 102 when the receiver 108 is receiving a signal to indicate that bias cancellation is to be on.

Though the use of the signals received from the lines 122, 118, and 116, the ABD 102 may have either a positive bias or a negative bias. The ABD 102 transmits a correction signal to the lines 110 and 112 depending on the positive or negative bias to change the offset to have a correct duty cycle.

In one embodiment, the offset cancellation system, which may include the Circuit 114, the ABD 102, and the DAC 104, sources a small current to a SCSI bus such as, for example, the lines 110 and 112 when data is received by, for example, a chip. An offset cancellation current controlled by the Circuit 114 is adjusted to compensate for any DC offset present on the SCSI signal line. The input value to a digital to analog converter is determined during the high frequency portion of the training pattern. The logic within the Circuit 114 determines when the offset calibration process should occur and also determines the actual digital to analog input value which is the sign bit and the 5 magnitude bits. Therefore, the Circuit 114 measures the SCSI signal offset by determining the high versus low time of the SCSI signal during the high frequency part of the training pattern. In one embodiment, oversampled signals under good conditions will have a sample count of 20 for both high and low. When unequal high/low counts are found, this indicates an offset and correction is made to optimize data transfer processes.

In one embodiment, 20 counts are obtained for the high part of the signal and 20 counts for the low part of the signal. As discussed below in further detail in reference to FIG. 3, a reference source that is N times greater than the input data may be utilized. Therefore, for every data period, 2N oversamples are generated. The number of high samples and the number of low samples are compared. The error is the number of samples that the duty cycle is off from the ideal. The present invention provides correction signal that is equal and opposite to change the offset to cure the duty cycle error. The error detected is driven to zero. As a result, offset errors that can cause duty cycle errors in data transmission may be intelligently detected through oversampling. The offset errors are then driven to zero enabling elimination of duty cycle errors.

Figure 3:
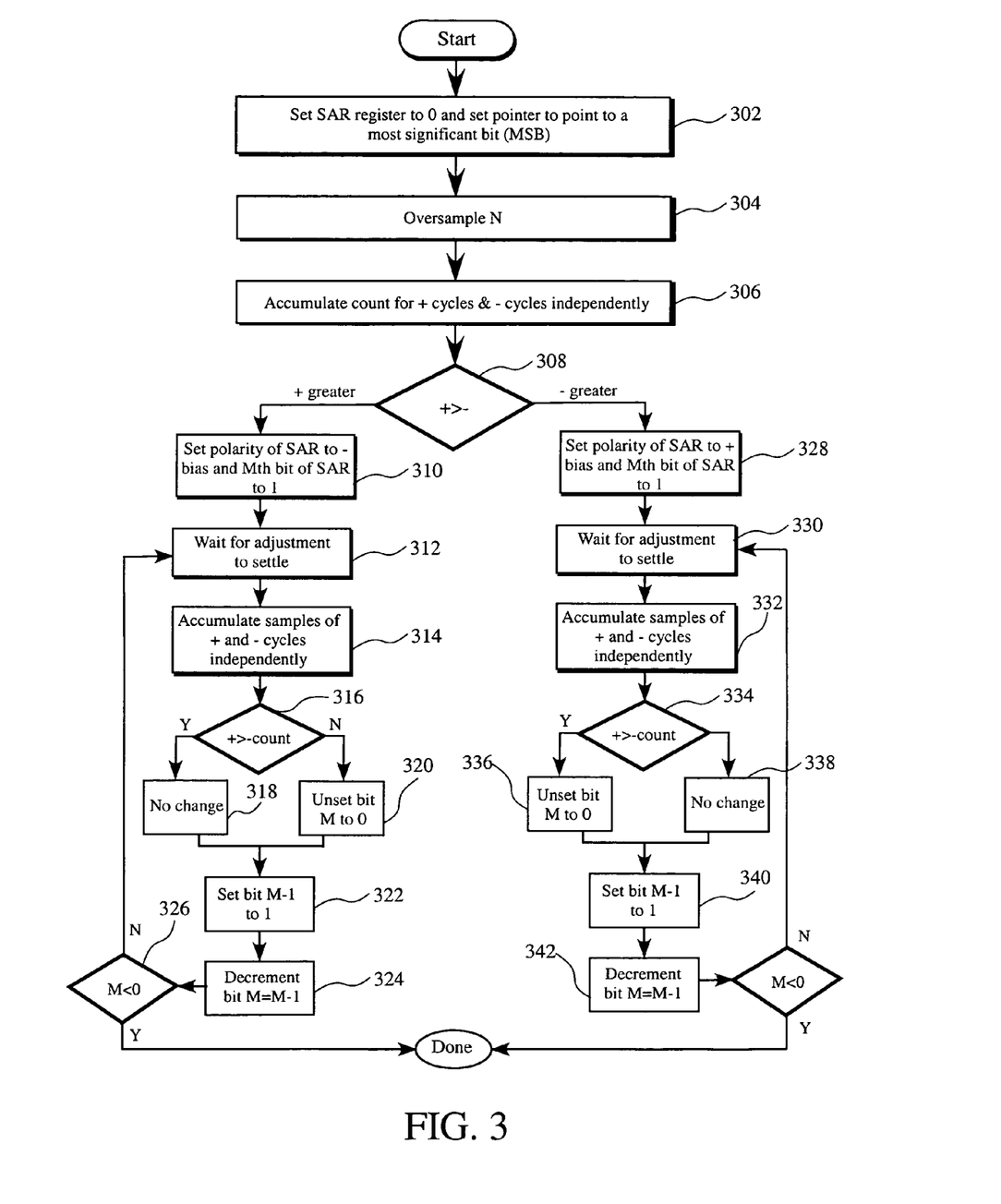
FIG. 3 illustrates a flowchart defining a method for reducing receiver offset in accordance with one embodiment of the present invention.

FIG. 3 illustrates a flowchart 300 defining a method for reducing receiver offset in accordance with one embodiment of the present invention. In this embodiment, the method begins with operation 302 where a successive approximation register (SAR) is set to 0 and a pointer is set to point to a most significant bit (MSB). The approximation process sets the polarity bit first. The SAR register may contain any number of suitable bits that is desired depending on the particular implementation. In one embodiment, the SAR register may include 6 bits where 5 bits are magnitude (also known as magnitude data) and 1 bit is polarity (also known as polarity data). The pointer M is used at a later operation to sequentially set the magnitude bit to a value that indicates a negative or positive bias needed to drive offset errors to zero. After operation 302, the method moves to operation 304 which oversamples N. In operation 304, the method samples N times the amount of data that is sent in a particular period as determined by a clock cycle. For example, in one embodiment when data is sent during a 10 ns period, N times the 10 ns period worth of data is oversampled. In this way, a true indication of data transfer media effectiveness may be determined by sampling data from multiple periods. Therefore, any one time aberration of data transmission may be averaged out by data transmission in other clock cycles.

After operation 304, the method moves to operation 306 where count for positive cycles and negative cycles are accumulated independently. It should be understood that the accumulation of positive cycles and negative cycles may be averaged or summed depending on the desired method of comparison. For example, any number of positive cycles (periods) and any number of negative cycles (periods) may be separately summed and compared. The difference between the two total may be examined and the sign of the difference is examined. Then the method advances to operation 308 which decides if the positive cycles are greater or the negative cycles are greater. Depending on whether the positive cycles are greater or the negatives cycles are greater, a polarity bit and a most significant bit (MSB) may be suitably utilized to determine polarity of the SAR and the bias (by use of the MSB as to whether positive or negative bias) to be used. If the positive cycles are greater, the method moves to operation 310 where a polarity of SAR is set to negative bias and SAR magnitude bit selected by pointer M is set to 1. M is a pointer used to select the specific magnitude bit being set or cleared. The SAR magnitude bit selected by the pointer is described as the Mth bit or bit M. The Mth bit as described herein is the most significant bit (MSB) at this time.

Then the method proceeds to operation 312 which waits for adjustment to settle. After operation 314 the method moves to operation 314 where samples of positive and negative cycles are accumulated independently. Then the method progresses to operation 316 where it is decided if the positive cycles are greater than the negative cycles. If the positive cycles are greater then the method advances to operation 318 where no change is made, and the bit M is left at 1. If the negative cycles are greater than the positive cycles, then the correction made by the bit M is greater than the bias error and the method moves to operation 320 where bit M is unset to 0. Bit M is a pointer used to select the specific magnitude bit being set or cleared. After either operation 318 or operation 320, the method advances to operation 322 where bit M−1 is set to 1. Then the method moves to operation 324 which decrements M=M−1. Operation 324 decrements the SAR pointer to a next bit. After operation 324, the method progresses to operation 326 where it is determined if M<0. If M is less than 0 then the method terminates. If M is not less than 0 then the method moves back to operation 312 and repeats operations 314, 316, 318 (or 320), 322, 324 and 326.

If the count for the negative cycles is greater than the positive cycles as determined in operation 308, the method moves to operation 328 where polarity of SAR is set to positive bias and the Mth bit of SAR is set to 1. Then the method advances to operation 330 which waits for adjustment to settle. After operation 330, the method moves to operation 332 where samples of positive and negative cycles are accumulated independently. Then the method progresses to operation 334 where it is determined if the positive count is greater than the negative count. If the positive count is greater than the negative count, the method moves to operation 336 where bit M is unset to 0. If the positive count is not greater than the negative count then the method advances to operation 338 where there is no change made in the M bit. After either operation 336 or 338, the method moves to operation 340 where bit M−1 is set to 1. The method then advances to operation 342 which decrements M=M−1. After operation 342, the method moves to operation 344 and determines if M<0. If M is less than zero then the method terminates. If M is not less than zero then the method moves back to operation 330 and repeats operations 330, 332, 334, 336 (or 338), 340, 342, and 344. The first magnitude bit operated on is the MSB, the process then continues down to the least significant bit and ends. If M=4 then the pointer is pointing to the MSB and if M=0 then the M is pointing to the LSB.

If the count for negative cycles is greater than the positive cycles as determined in operation 308, the method moves to operation 328 where a polarity of SAR is set to a positive bias and the Mth bit of SAR is set to 1. Then the method advances to operation 330 which waits for the adjustment to settle. After operation 330, the method moves to operation 332 where samples of positive and negative cycles are accumulated independently. Then the method progresses to operation 334 where it is determined if the positive count is greater than the negative count. If the positive count is greater than the negative count, the method moves to operation 336 where bit M is unset to 0. If the positive count is not greater than the negative count then the method advances to operation 338 where there is o change made in the M bit. After either operation 336 or 338, the method moves to operation 340 where bit M−1 is set to 1. The method then advances to operation 342 which decrements M=M−1. After operation 342, the method moves to operation 344 and determines if M<0. If M is less than zero then the method terminates. If M is not less than zero then the method moves back to operation 330 and repeats operations 330, 332, 334, (336 or 338), 340, 342, and 344.]

By use of the method as described in flowchart 300, duty cycle errors may be corrected in a data transmission system thereby enhancing accuracy of data transmission. The amount of data transmitted in a certain period of time may also be optimized due to less errors taking place during data transmission.

Figure 4:
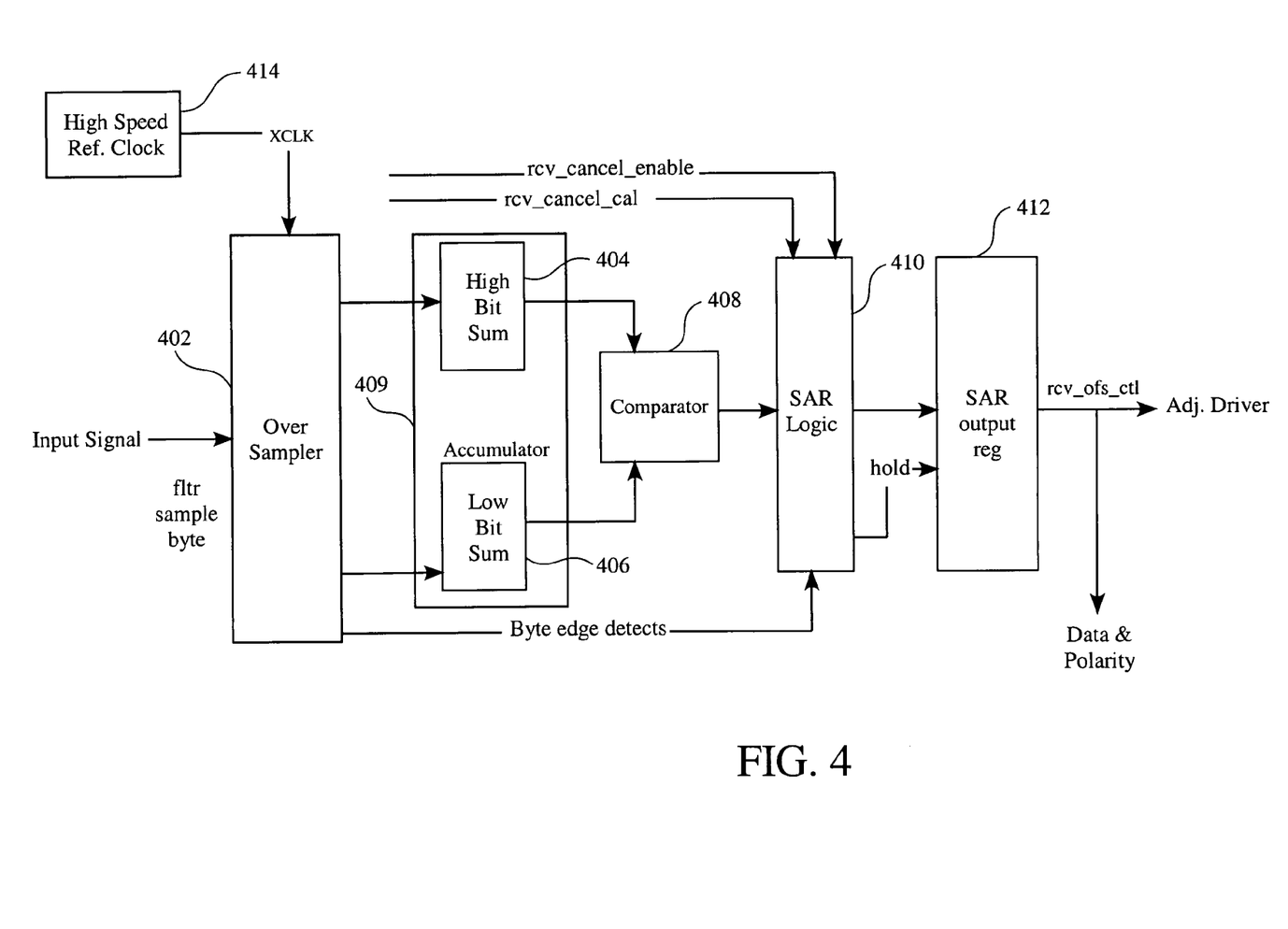
FIG. 4 shows a block diagram of an exemplary logic within the oversampler and SAR Logic Circuitry in accordance with one embodiment of the present invention.

FIG. 4 shows a block diagram 400 of an exemplary logic within the Oversampler and SAR Logic Circuitry 114 in accordance with one embodiment of the present invention. The logic shown in FIG. 4 is located within the Circuitry 114 as shown in FIG. 2. The logic as shown in the block diagram 400 uses a successive approximation scheme, driven by an output of a high and a low count comparison to set first the polarity and then the magnitude of an offset_control value. A state machine that controls the system is started by a rcv_cancel_enable signal received from an scs_input_sync block when it detects the beginning of the high frequency part of a training pattern. The state machine computes the offset_control value and store it until cleared by cancel_enable going false (reset, bus free, quick arbitration and select (QAS), or software disable). The initial reset value (00) sets the offset cancel current to 0 and is used for nonSPI-4 transfers or when offset cancellation is disabled.

In this embodiment, input signal is directed to an oversampler 402 which sends oversampled data to an accumulator 409. The oversampler 402 performs operation 304 as described in reference to FIG. 3. The accumulator 409 then generates a high bit sum 404 and a low bit sum 406 from the oversampled data and sends the high bit sum 404 and the low bit sum 406 to a comparator 408. The accumulator 409 accumulates counts for positive cycles and negative cycles independently. The comparator 408 compares the high bit sum and the low bit sum and sends the results to an SAR logic 410. The comparator 408 determines whether the positive cycles are greater than the negative cycles. The SAR logic 410 may receive an input instructing it to operate or shut down as exemplified by the rcv_cancel_enable signal and the rcv_cancel_cal signal respectively. The SAR logic receives a compared signal from the comparator and determines polarity data and magnitude data to correct a duty cycle error. The SAR logic 410 performs the operations after operation 308 as described in reference to FIG. 3. The SAR Logic 410 then sends the signal to an SAR output register 412. The SAR output register 412 then sends the polarity portion of the signal to an adjustable driver and sends the magnitude portion of the signal to the DAC. The DAC then sends the magnitude signal to the ABD after processing. The adjustable driver may utilize the signal from the SAR output register 412 to provide a bias to the transmission lines enabling the bias to be pushed toward zero. Consequently, any error in duty cycle may be corrected with correction from the adjustable driver.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. An apparatus for correcting duty cycle error in a data transmission system, comprising:
    an oversampler being configured to oversample an input signal;
    an accumulator coupled to the oversampler, the accumulator being configured to generate an accumulated high bit signal and an accumulated low bit signal from the oversampled input signal received from the oversampler;
    a comparator coupled to the accumulator, the comparator being configured to receive an accumulated high bit signal and an accumulated low bit signal from the accumulator, the comparator also being configured to compare an amount of the accumulated high bit signal and the accumulated low bit signal;
    a successive approximation register (SAR) logic coupled to the comparator, the SAR logic being configured to receive a compared signal from the comparator and to determine a duty cycle error, the SAR logic capable of generating polarity data and magnitude data for correcting the duty cycle error; and
    an output register coupled to the SAR logic, the output register being configured to forward the polarity data to an adjustable driver and to send the magnitude data to a digital analog converter (DAC).

2. An apparatus for correcting duty cycle error as recited in claim 1, wherein the oversampler, the accumulator, the comparator, the SAR register logic, and the output register are circuitry included in an oversampler and SAR control logic circuitry.

3. An apparatus for correcting duty cycle error as recited in claim 1, further comprising:
    a bias driver configured to drive the duty cycle error to zero by using the polarity data from the output register and the magnitude data from the DAC.

4. An apparatus for correcting duty cycle error as recited in claim 1, wherein the oversampler sends a low bit sum and a high bit sum to the accumulator.

5. An apparatus for correcting duty cycle error as recited in claim 1, wherein the comparator examines the accumulated high bit signal and the accumulated low bit signal and determines whether positive cycles are greater than negative cycles.

6. An apparatus for correcting duty cycle error as recited in claim 1, wherein the oversampler uses a high speed reference clock to oversample the input signal.

7. An apparatus for correcting duty cycle error as recited in claim 1, wherein the SAR logic sets an SAR to 0 and a the SAR logic sets pointer M to point to a most significant bit (MSB) before receiving an oversampling of data.

8. An apparatus for correcting duty cycle error as recited in claim 7, wherein the SAR includes 6 bits where 5 bits indicate magnitude and 1 bit indicates polarity.

9. An apparatus for correcting duty cycle error as recited in claim 7, wherein the pointer M is used to sequentially set a magnitude bit to a value that indicates one of a negative and positive bias needed to drive offset errors to zero.

10. An apparatus for correcting duty cycle error as recited in claim 1, wherein the oversampler samples N times an amount of data that is sent in a particular period as determined by a clock cycle.

11. An apparatus for correcting duty cycle error, comprising:
    circuitry being capable of determining existence of a duty cycle error from input data received over data transmissions lines, the circuitry also being capable of generating duty cycle correction data based on the duty cycle error;
    a digital analog converter (DAC) being coupled to the circuitry, the DAC capable of receiving a magnitude portion of the duty cycle correction data from the circuitry;
    an adjustable bias driver being coupled to the circuitry, the DAC and the data transmission lines;
    wherein the adjustable bias driver is configured to receive the magnitude portion of the duty cycle correction data from the DAC and to receive a polarity portion of the duty cycle correction data from the circuitry, the adjustable bias driver capable of adjusting the polarity of signals applied to the data transmission lines for correcting the duty cycle error.

12. An apparatus for correcting duty cycle error as recited in claim 11, wherein the oversampler and SAR control logic circuitry include an oversampler, an accumulator, a comparator, an SAR register logic, and an output register.

13. An apparatus for correcting duty cycle error as recited in claim 12, wherein the oversampler uses a high speed reference clock to oversample data.

14. An apparatus for correcting duty cycle error as recited in claim 11, wherein the circuitry includes;
    circuitry for summing a plurality of positive duty cycles from an oversample of data;
    circuitry for summing a plurality of negative duty cycles from the oversample of data;
    circuitry for comparing the summed plurality of positive duty cycles with the summed plurality of negative duty cycles; and
    circuitry for generating duty cycle correction data with a negative bias when the summed plurality of positive duty cycles is greater than the summed plurality of negative duty cycles and with a positive bias when the summed plurality of positive duty cycles is less than the summed plurality of negative duty cycles.

15. A method for correcting duty cycle error in a data transmission system, comprising:
    receiving an oversample of data;
    summing a plurality of positive duty cycles from the oversample of data;
    summing a plurality of negative duty cycles from the oversample of data;
    comparing the summed plurality of positive duty cycles with the summed plurality of negative duty cycles; and
    driving a duty cycle to zero by adjusting an output of a bias driver to a negative bias when the summed plurality of positive duty cycles is greater than the summed plurality of negative duty cycles, and by adjusting the output of the bias driver to a positive bias when the summed plurality of positive duty cycles is less than the summed plurality of negative duty cycles.

16. A method for correcting duty cycle error as recited claim 15, wherein adjusting the output of the bias driver to the negative bias and adjusting the output of the bias driver to the positive bias are determined by an oversampler and successive approximation register (SAR) logic control circuitry.

17. A method for correcting duty cycle error as recited claim 15, wherein the bias driver is an adjustable bias driver.

18. A method for correcting duty cycle error as recited in claim 15, wherein the oversampling includes sampling N times an amount of data that is sent in a particular period as determined by a clock cycle.

19. A method for correcting duty cycle error as recited in claim 15, wherein the summing a plurality of positive duty cycles and the summing a plurality of negative duty cycles are accumulated independently.

20. A method for correcting duty cycle error as recited in claim 15, wherein a successive approximation register (SAR) is set to 0 and a pointer M is set to point to a most significant bit (MSB) before receiving the oversample of data.

21. A method for correcting duty cycle error as recited in claim 20, wherein the SAR includes 6 bits where 5 bits indicate magnitude and 1 bit indicate polarity.

22. A method for correcting duty cycle error as recited in claim 20, wherein the pointer M is used to sequentially set a magnitude bit to a value that indicates a negative or positive bias needed to drive offset errors to zero.

23. A method for correcting duty cycle error in a data transmission system, comprising:

determining a duty cycle error from input data; and driving the duty cycle error to zero by directing a bias driver to output one of a negative bias and a positive bias to data transmission lines carrying the input data, wherein driving the duty cycle to zero includes calculating a magnitude signal and a polarity signal to send to the bias driver to drive the duty cycle error to zero.

24. A method for correcting duty cycle error as recited in claim 23, wherein determining the duty cycle includes, receiving an oversample of the input data, summing a plurality of positive duty cycles from the oversample of the input data, summing a plurality of negative duty cycles from the oversample of the input data, and comparing the summed plurality of positive duty cycles with the summed plurality of negative duty cycles.

25. A method for correcting duty cycle error as recited in claim 24, wherein the bias driver is directed to output a negative bias when the summed plurality of positive duty cycles is greater than the summed plurality of negative duty cycles, and the bias driver is directed to output a positive bias when the summed plurality of positive duty cycles is less than the summed plurality of negative duty cycles.

* * * * *